United States Patent
Lai

(10) Patent No.: US 6,371,770 B1
(45) Date of Patent: Apr. 16, 2002

(54) CARD CONNECTOR ASSEMBLY FOR PORTABLE ELECTRONIC DEVICE

(75) Inventor: Ming-Chun Lai, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/751,709

(22) Filed: Dec. 28, 2000

(30) Foreign Application Priority Data

Sep. 29, 2000 (TW) .......................................... 89216960

(51) Int. Cl.[7] .............................................. H01R 12/24
(52) U.S. Cl. ............................ 439/67; 439/74; 439/534
(58) Field of Search ........................... 439/534, 541.5, 439/67, 77, 492, 74

(56) References Cited

U.S. PATENT DOCUMENTS

| | | | | |
|---|---|---|---|---|
| 5,709,568 A | * | 1/1998 | Pan et al. ................. | 439/541.5 |
| 6,017,222 A | * | 1/1998 | Kao ............................ | 439/67 |
| 5,947,753 A | * | 9/1999 | Chapman et al. ............. | 439/67 |
| 5,947,764 A | * | 9/1999 | Pan et al. .................... | 439/492 |

* cited by examiner

*Primary Examiner*—Gary Paumen
*Assistant Examiner*—James R. Harvey
(74) *Attorney, Agent, or Firm*—Wei Te Chung

(57) ABSTRACT

A card connector assembly 3 comprises a support board 1, a card connector 30 a flexible printed circuit board 31, and a connection mechanism 32. The support board is rotatably fixed at a top surface of an enclosure of an electronic device 2. The card connector is mounted on the support board generally confronting a PCB 5 located within the enclosure. The card connector has a plurality of terminals 301 received therein, which connect to one end of the flexible printed circuit board. The connection mechanism connects the other end of the flexible printed circuit board to the PCB, for transferring signals stored in a card inserted into the card connector assembly to the PCB.

3 Claims, 5 Drawing Sheets

CARD CONNECTOR ASSEMBLY FOR PORTABLE ELECTRONIC DEVICE

BACKGROUND OF THE INVENTION

1. Field of the Invention

The present invention relates to a card connector assembly, and particularly to a card connector assembly which is used in a portable electronic device and which can be easily replaced.

2. Description of the Prior Art

Card connector assemblies are commonly used to transmit signals from a card to a central processing unit of an electronic device. Data stored in any one typical card is limited, so the electronic device must typically receive different cards to perform different functions. Therefore, card connector assemblies must be designed to facilitate insertion and removal of cards. A conventional card connector assembly is typically mounted in an electronic device at a position such that a card is inserted into the connector assembly from an edge of the electronic device. FIG. 5 which shows a conventional card connector assembly 20' taken from U.S. Pat. No. 5,492,764. Contacts 14' in the card connector assembly 20' are connected to a flexible printed circuit board 50'. The flexible printed circuit board 50' is pressed onto a printed circuit board (PCB) 12' by a presser 30', to establish an electrical connection.

However, this configuration requires free space at an edge of the electronic device, to enable a card to be inserted into the card connector ssembly 20'. As electronic devices are being made smaller and smaller, the egion around the edge of an electronic device is increasingly being used for ther purposes such as providing input/output connectors. Thus the free space required by the card connector assembly 20' is becoming less and less available. Additionally, replacing the card connector assembly 20' with another card connector assembly is cumbersome and time-consuming.

Therefore, an improved card connector assembly is desired to overcome the disadvantages of the prior art.

BRIEF SUMMARY OF THE INVENTION

A first object of the present invention is to provide a card connector assembly which when mounted in an electronic device does not require a card to be extended though an edge of the electronic device to enter the connector assembly.

A second object of the present invention is to provide a card connector assembly which when mounted in an electronic device is easily replaced by another card connector assembly.

To achieve the above-mentioned objects, a card connector assembly for a portable electronic device in accordance with the present invention comprises a support board positioned at an opening defined at a top surface of an enclosure of the electronic device, a card connector with a plurality of terminals received therein, a flexible printed circuit board, and a connection mechanism. Two pivots are formed on respective opposite lateral sides of a portion of the support board. The card connector is fixed on the support board. One end of the flexible printed circuit board connects with the terminals received in the card connector, and the other end of the flexible printed circuit board connects with a PCB. The connection mechanism connect the flexible printed circuit board with the PCB. Thus, signals stored in a card inserted in the card connector can be transferred to the PCB though the card connector and the flexible printed circuit board.

To change the card inserted in the card connector, the support board is rotatably lifted out from an enclosure of the electronic device until the card connector is in an upwardly inclined orientation relative to the enclosure. This enables easy removal and insertion of the relevant cards. Finally, the support board is rotated downwardly to cover the opening.

Other objects, advantages and novel features of the invention will become more apparent from the following detailed description of the preferred embodiments when taken in conjunction with the accompanying drawings.

DETAILED DESCRIPTION OF THE INVENTION

Figure 1:
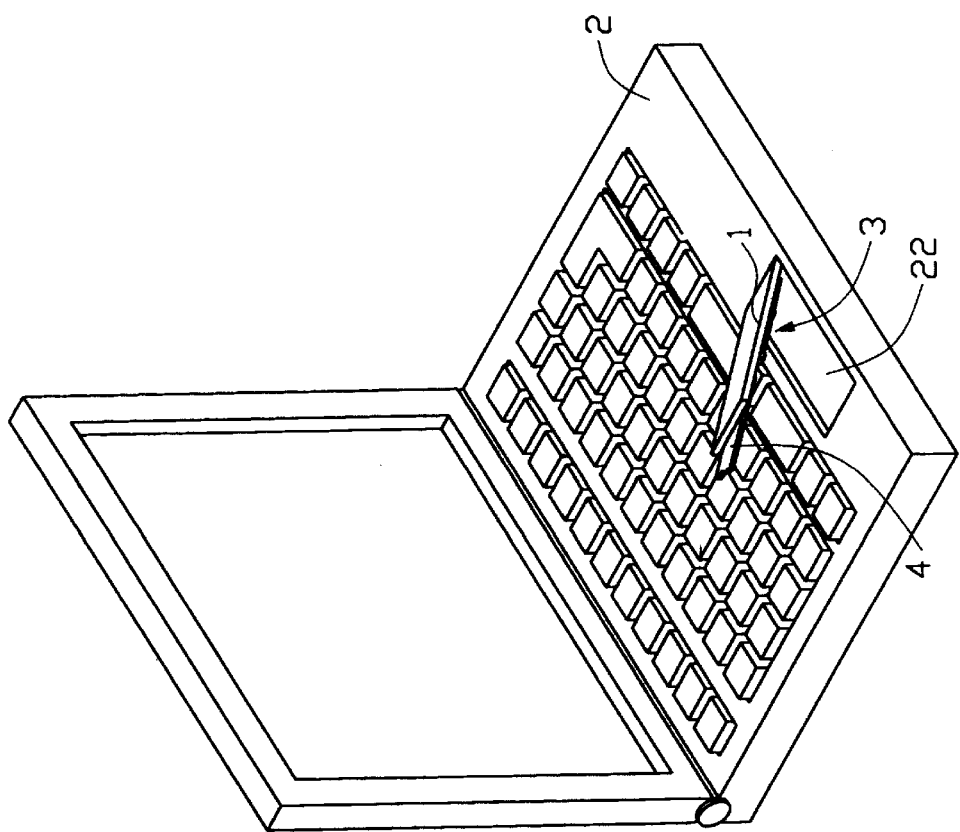
FIG. 1 is a perspective view of a notebook computer having a card connector assembly in accordance with a first embodiment of the present invention.
Figure 2:
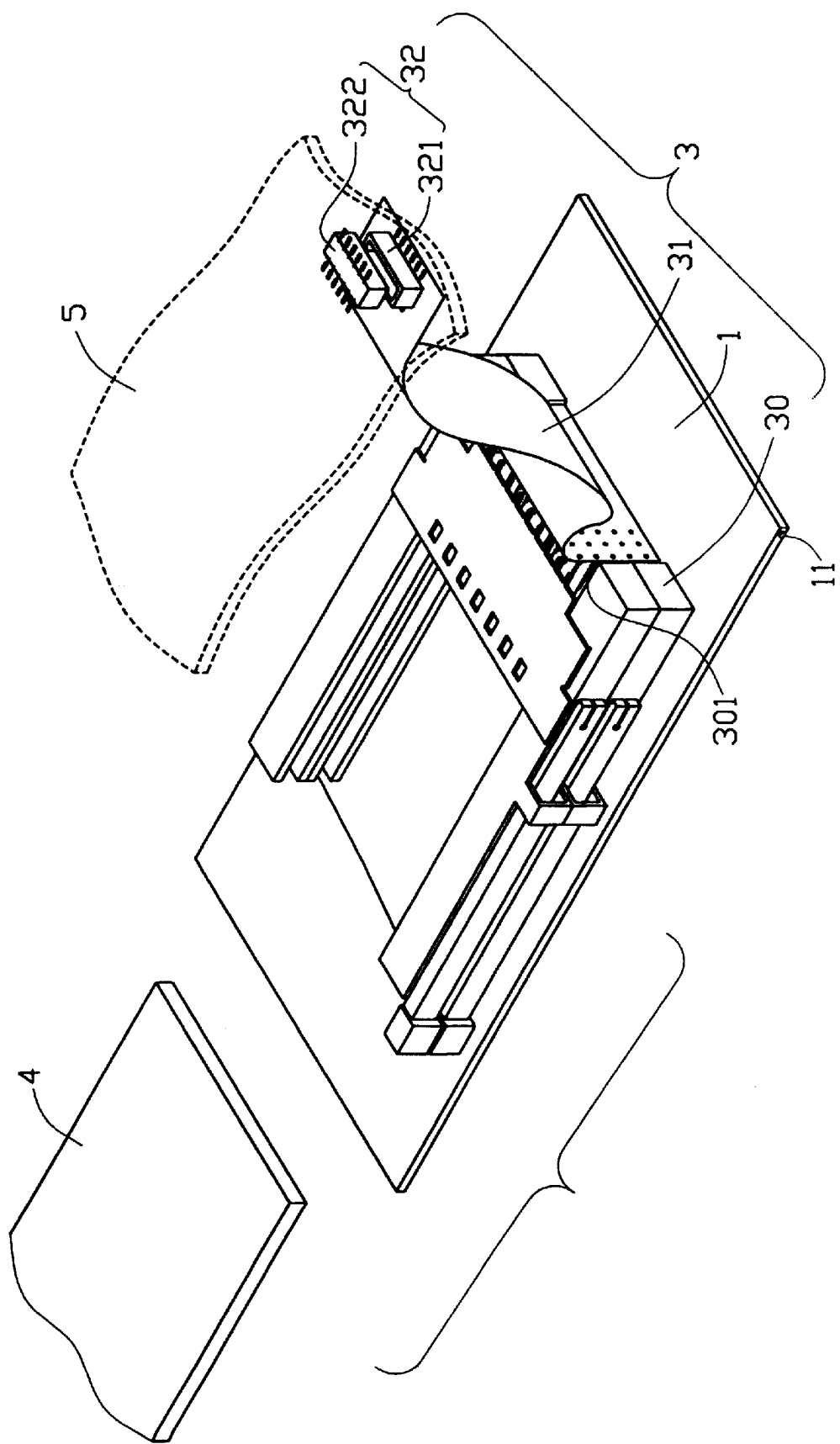
FIG. 2 is perspective view of the card connector assembly of FIG. 1 but viewed from a bottom aspect, together with a PCB and part of a card.
Figure 3:
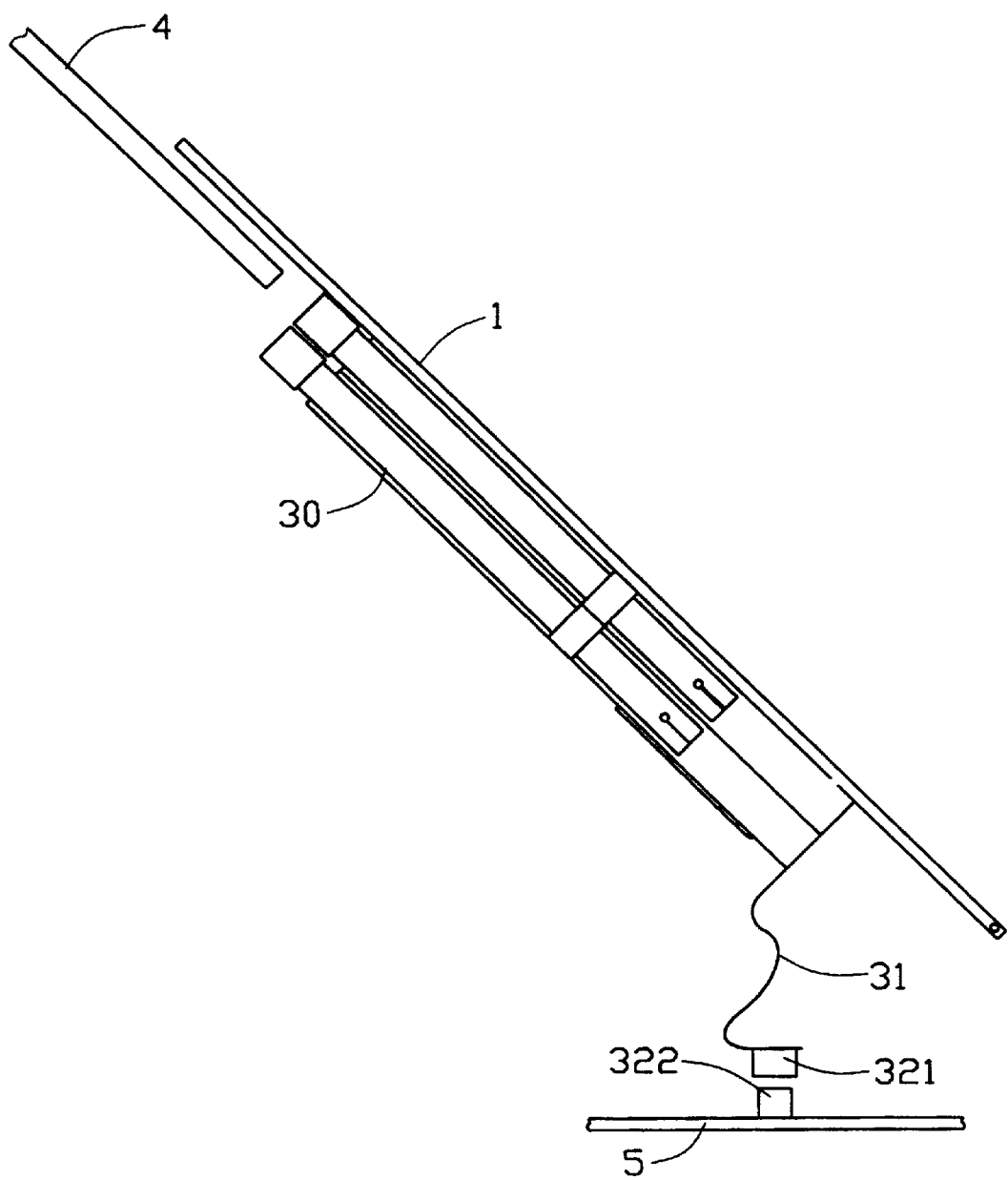
FIG. 3 is a side plan view of the card connector assembly of FIG. 1, together with part of a PCB and part of a card.

Referring to FIGS. 1–3, a card connector assembly 3 in accordance with a first embodiment of the present invention comprises a support board 1, a card connector 30, a flexible printed circuit board 31 and a connection mechanism 32. The support board 1 is received in an opening 22 defined in an upper surface of an enclosure of a notebook computer 2. A pair of external pivots 11 is formed on respective opposite lateral sides of the support board 1. The pivots 11 are pivotably connectable with a pair of recesses (not shown) defined in the upper surface of the enclosure of the notebook computer 2 at respective opposite sides of the opening 22, so that the support board 1 can be moved close to or away from the opening 22 of the notebook computer. The card connector 30 is mounted on an underside of the support board 1 with screws (not shown). A plurality of terminals 301 received in the card connector 30 are connected with one end of the flexible printed circuit board 31.

The connection mechanism 32 comprises a female board-to-board connector 321 and a male board-to-board connector 322. The female connector 321 is connected with another end of the flexible printed circuit board 31, and the male connector 322 is fixed on a PCB 5. By connecting the female connector 321 with the male connector 322, signals stored in a card 4 inserted in the card connector 30 can be transferred to the PCB 5 via the terminals 301 and the flexible printed circuit board 31.

To insert the card 4, the support board 1 is rotated up from the opening 22 of the notebook computer 2 to a position where the support board 1 and the card connector 30 are oriented in an upwardly inclined position relative to the PCB 5 (see FIG. 3). Then, the card 4 is inserted into the card connector 30 along the inclined direction to electrically connect with the card connector 30. Finally, the support board 1 is rotated downwardly to cover the opening 22.

To replace the card connector assembly 3 with a new card connector assembly is simple. The female connector 321 is separated from the male connector 322, and the card connector assembly 3 is unscrewed from the support board 1. The new card connector assembly is then mounted on the support board 1 with the screws (not shown). The female connector of the new card connector assembly is connected with the male connector 322.

Figure 4:
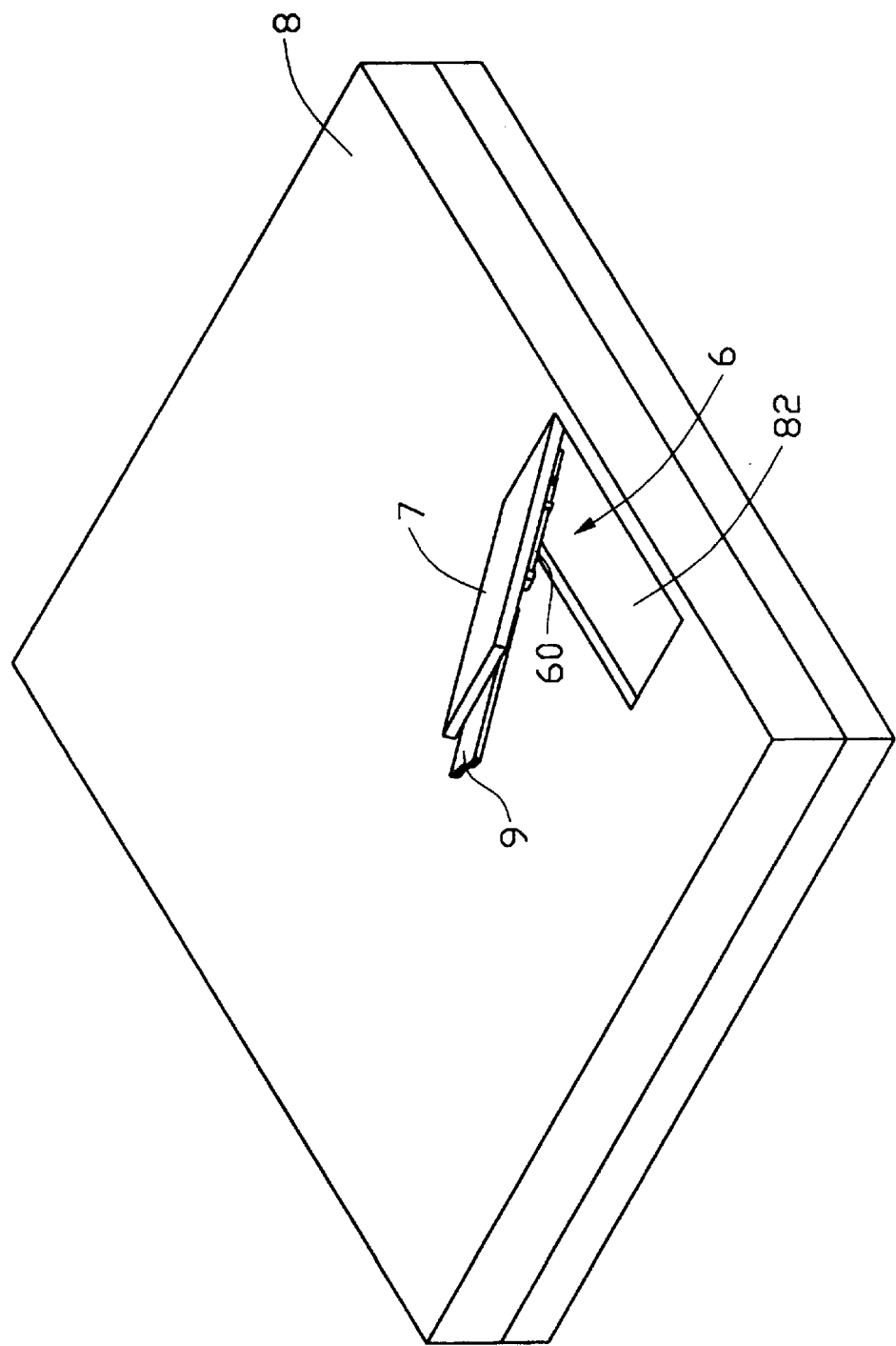
FIG. 4 is a perspective view of a notebook computer having a card connector assembly in accordance with a second embodiment of the present invention.
Figure 5:
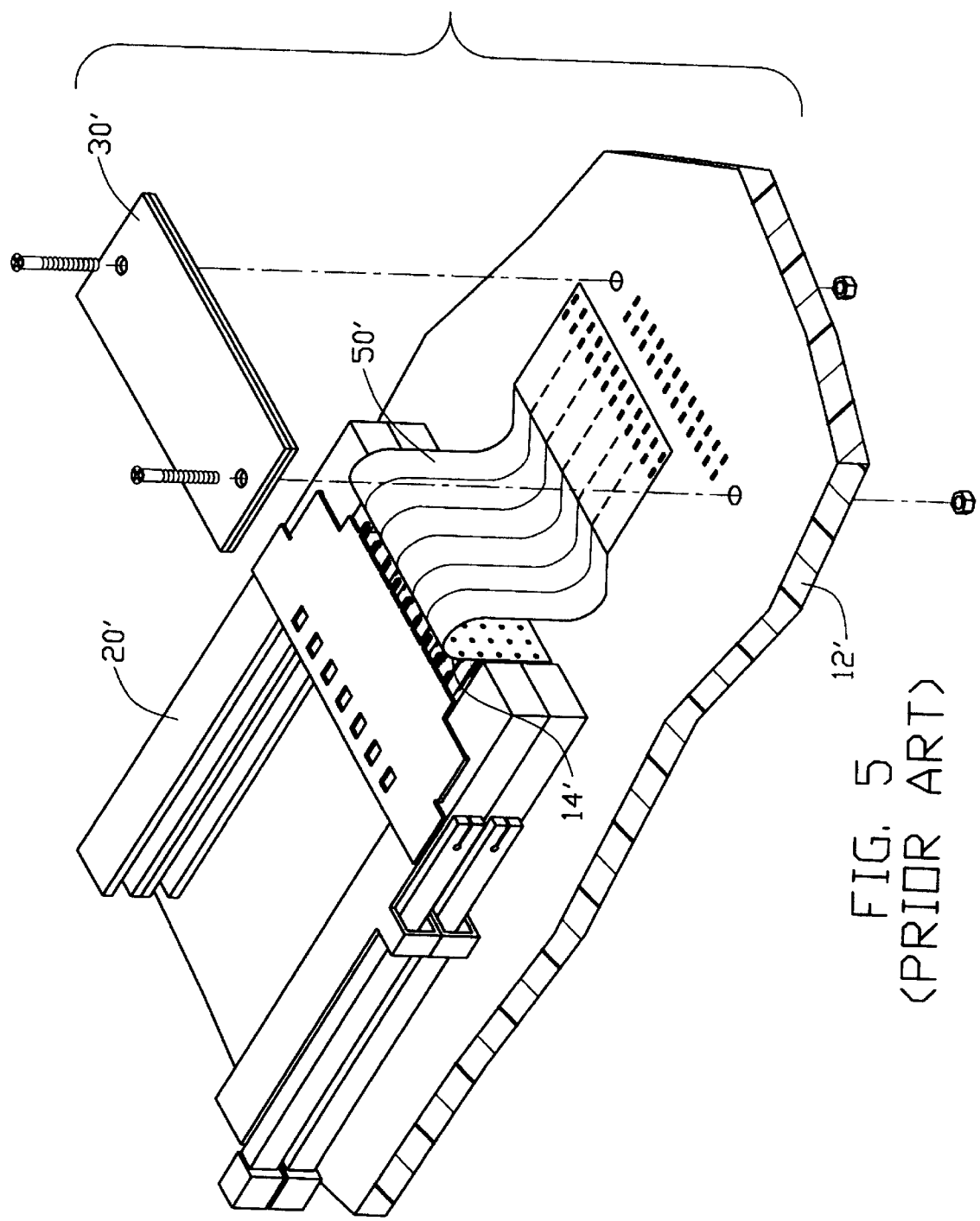
FIG. 5 is an exploded view of a conventional card connector assembly mountable on a PCB.

Referring to FIG. 4, a card connector assembly 6 in accordance with a second embodiment of the present invention is mounted in a notebook computer 8. The card connector assembly 6 is substantially the same as card connector assembly 3 of the first embodiment. A support board 7 is pivotably mounted in an opening 82 defined in a lower surface of an enclosure of the notebook computer 8. A card connector 60 is mounted on a lower side of the support board 7. To insert a card 9 or to replace the card connector assembly 6 with a new card connector assembly, the procedures are substantially the same as those for the first embodiment. However, the notebook computer 8 must of course be inverted in order to expose the lower surface of its enclosure.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A portable electronic device, comprising:

an enclosure defining an opening;

a support board rotatably mounted on the enclosure at the opening;

a printed circuit board received in the enclosure; and a card connector assembly for electrically connecting an electronic card with the device, comprising:
   a card connector mounted on the support board; and
   a flexible printed circuit board electrically connecting the card connector with the printed circuit board;
      wherein the flexible printed circuit board has one end portion electrically engaging with terminals of the card connector, and another end portion having a connector electrically connecting with a connector mounted on the printed circuit board;
      wherein the connector of the flexible printed circuit board and the connector mounted on the printed circuit board are both board-to-board connectors.

2. The portable electrical device as claimed in claim 1, wherein the opening is defined in an upper surface of the enclosure.

3. The portable electrical device as claimed in claim 1, wherein the opening is defined in a lower surface of the enclosure.

* * * * *